(12) United States Patent
Kamins et al.

(10) Patent No.: US 7,659,631 B2
(45) Date of Patent: Feb. 9, 2010

(54) INTERCONNECTION BETWEEN DIFFERENT CIRCUIT TYPES

(75) Inventors: Theodore I. Kamins, Palo Alto, CA (US); Shashank Sharma, San Jose, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 303 days.

(21) Appl. No.: 11/548,994

(22) Filed: Oct. 12, 2006

(65) Prior Publication Data

US 2008/0087998 A1 Apr. 17, 2008

(51) Int. Cl.
*H01L 23/538* (2006.01)
*H01L 21/768* (2006.01)

(52) U.S. Cl. .............. 257/775; 257/E23.174; 257/E21.578; 438/640

(58) Field of Classification Search .......... 257/775, 257/E23.067, E21.577; 438/640
See application file for complete search history.

(56) References Cited

U.S. PATENT DOCUMENTS

| 5,269,880 | A | 12/1993 | Jolly et al. |
| 6,875,671 | B2 | 4/2005 | Faris |
| 6,905,955 | B2 | 6/2005 | Basceri et al. |
| 7,033,910 | B2 | 4/2006 | Faris |
| 7,056,751 | B2 | 6/2006 | Faris |

FOREIGN PATENT DOCUMENTS

KR 10-2004-0045111 * 11/2002

OTHER PUBLICATIONS

Charles M. Lieber, "The Incredible Shrinking Circuit", Scientific American, Sep. 2001, pp. 59-64.

* cited by examiner

*Primary Examiner*—Victor A Mandala

(57) ABSTRACT

A hybrid-scale electronic circuit, an internal electrical connection and a method of electrically interconnecting employ an interconnect having a tapered shape to electrically connect between different-scale circuits. The interconnect has a first end with an end dimension that is larger than an end dimension of an opposite, second end of the interconnect. The larger first end of the interconnect connects to an electrical contact of a micro-scale circuit and the second end of the interconnect connects to an electrical contact of a nano-scale circuit.

20 Claims, 6 Drawing Sheets

INTERCONNECTION BETWEEN DIFFERENT CIRCUIT TYPES

STATEMENT REGARDING FEDERALLY SPONSORED RESEARCH OR DEVELOPMENT

N/A

BACKGROUND

1. Technical Field

The invention relates to nanotechnology. In particular, the invention relates to electrical interconnection between nanoelectronic circuits and conventional electronic circuits.

2. Description of Related Art

A consistent trend in semiconductor technology since its inception is toward smaller and smaller device dimensions and higher and higher device densities. As a result, an area of semiconductor technology that recently has seen explosive growth and generated considerable interest is nanotechnology. Nanotechnology is concerned with the fabrication and application of so-called nano-scale structures, structures having at least one linear dimension between 1 nm and 200 nm. These nano-scale structures are often 5 to 100 times smaller than conventional semiconductor structures.

A growing area of nanotechnology is nanoelectronics. Nanoelectronics includes nano-scale electronic devices, such as nano-scale field effect transistors (FETs), p-n diodes, light emitting diodes (LEDs) and sensors, to name a few. Nanoelectronics may coexist with conventional electronics (e.g., microelectronics) in the near future as so-called 'hybrid' electronic integrated circuits, i.e., electronic circuits that comprise both nanocircuitry and conventional electronic circuitry. As such, their coexistence will need ways to interconnect the nanoelectronic circuitry to the conventional electronic circuitry within so-called hybrid electronic integrated circuits in a compatible way that is reproducible in a manufacturing environment.

BRIEF SUMMARY

In some embodiments of the present invention, a hybrid-scale electronic circuit is provided. The hybrid-scale electronic circuit comprises a nanoelectronic circuit having a nano-scale electrical contact, a microelectronic circuit having a micro-scale electrical contact and an interconnect extending through an insulator layer that separates the nanoelectronic circuit and the microelectronic circuit. The interconnect has a tapered shape, such that a first end of the interconnect has an end dimension that is larger than an end dimension of the second end of the interconnect. The first end connects to the micro-scale electrical contact and the second end connects to the nano-scale electrical contact.

In other embodiments of the present invention, an internal electrical connection for a hybrid-scale electronic circuit is provided. The internal electrical connection comprises an interconnect having an axial length and a tapered shaped along the axial length. A first end of the interconnect has an end dimension that approximates a micro-scale dimension and a second end of the interconnect has an end dimension that approximates a nano-scale dimension. The interconnect provides a reduced series resistance connection between different-scale circuits of the hybrid-scale electronic circuit relative to a conventional columnar interconnect.

In other embodiments of the present invention, a method of electrically interconnecting different-scale circuit layers of a hybrid-scale electronic circuit is provided. The method comprises providing a first circuit layer having an electrical contact and providing an interconnect on the first circuit layer. The method further comprises providing a second circuit layer having an electrical contact. One of the first circuit layer and the second circuit layer is a micro-scale circuit and another of the circuit layers is a nano-scale circuit. The interconnect electrically connects between the first circuit layer and the second circuit layer at the respective electrical contacts. The interconnect has an axial length and a tapered shape along the axial length, such that one end of the interconnect has a larger end dimension than an opposite end of the interconnect. The end of the interconnect having the larger end dimension interfaces to the micro-scale circuit and the opposite end interfaces to the nano-scale circuit.

Certain embodiments of the present invention have other features that are one or both of in addition to and in lieu of the features described hereinabove. These and other features of some embodiments of the invention are detailed below with reference to the following drawings.

BRIEF DESCRIPTION OF THE DRAWINGS

The various features of embodiments of the present invention may be more readily understood with reference to the following detailed description taken in conjunction with the accompanying drawings, where like reference numerals designate like structural elements, and in which.

DETAILED DESCRIPTION

Figure 1:
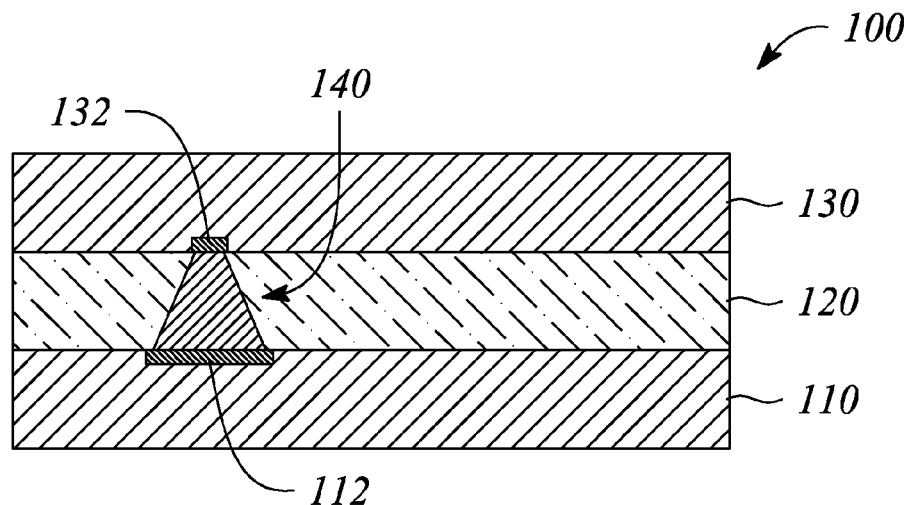
FIG. 1 illustrates a cross-sectional view of a hybrid-scale electronic circuit having an internal electrical connection between different circuit types according to an embodiment of the present invention.

Embodiments of the present invention employ an internal electrical connection within a 'hybrid-scale' circuit. For the purposes of the embodiments herein, a 'hybrid-scale' circuit is defined as a single integrated circuit chip that comprises both a nano-scale circuit and a conventional-scale circuit. The internal electrical connection (herein also referred to as an 'interconnect') is between the nano-scale circuit and the conventional-scale circuit of the hybrid-scale circuit. The interconnect is compatible with the different-scale circuit types of the hybrid-scale circuit. The term 'circuit' may be used herein to mean one or more of a circuit that comprises a device; a circuit that comprises a circuit layer, and a circuit layer that comprises a device. As such, in some embodiments, the terms 'circuit' and 'circuit layer' may be used interchangeably, for simplicity of discussion and not by way of limitation.

Nanoelectronic circuitry is characterized by nano-scale circuit elements having feature sizes that are smaller than the circuit elements found in conventional electronic circuitry. In contrast, conventional electronic circuitry is characterized by having micro-scale circuit elements. For the purposes of the various embodiments of the present invention herein, the term 'conventional' circuitry or circuit means exclusive of nanoscale circuitry with respect to the internal electrical connection. It should be understood that while a micro-scale circuit may comprise nano-scale portions (i.e., circuit elements) and a nano-scale circuit may comprise micro-scale portions (i.e., circuit elements), the internal electrical connection between the different circuit types is directed to an interconnect between a nano-scale electrical contact of one circuit and a micro-scale electrical contact of the other circuit in the hybrid-scale electronic integrated circuit, according to the various embodiments of the present invention.

For the purposes of the embodiments of the present invention herein, a 'nano-scale' electrical contact of a nano-scale circuit has a linear dimension (i.e., 'nano-scale dimension') that is smaller than a linear dimension of a 'micro-scale' electrical contact of a micro-scale circuit (i.e., 'micro-scale dimension'). In some embodiments, 'nano-scale' means that at least one linear dimension of the nano-scale electrical contact is less than about 40 nm. In some embodiments, the linear dimension of the nano-scale electrical contact is between 10 nm and 40 nm. On the other hand, in some embodiments, 'micro-scale' means at least one linear dimension of the micro-scale electrical contact is greater than about 80 nm. In some embodiments, the linear dimension of the micro-scale electrical contact is between 80 nm and 200 nm. In some embodiments, the linear dimension of the microscale electrical contact is greater than about 200 nm. Such conventional dimensions are dimensions found in conventional circuits including, but not limited to, CMOS, VLSI and other state-of-the-art integrated circuits (ICs). The 'electrical contact' of such ICs is sometimes referred to as a 'via' in the art depending on the IC metallization layer in which the contact or via is formed. Herein, no distinction is made as to which IC metallization layer that the contact or via is located, such that the term 'electrical contact' is used herein to mean both 'contact' and 'via'.

According to various embodiments of the present invention, the internal electrical connection that bridges between the nanoelectronic circuitry and the conventional electronic circuitry of the hybrid-scale circuit is able to electrically interface the conventional circuitry with the inherently small features sizes of the nanoelectronic circuitry. The internal electrical connection provides compatible interconnection characteristics including, but not limited to, one or both of relatively low series resistance and high reliability and therefore, provides inherent robustness. Moreover, the electrical interconnect and the hybrid-scale circuit that comprises the electrical interconnect are conducive to a 'bottom-up' fabrication approach in a manufacturing environment.

The term 'conventional' or 'conventional-scale' may be used interchangeably herein with the term 'micro-scale' for simplicity of discussion and not by way of limitation. As such, the term 'micro-scale circuitry' may be used interchangeably with 'microelectronic circuit' and 'micro-scale circuit' to mean a conventional electronic circuit or circuit layer. Moreover, the term 'nano-scale circuitry' may be used interchangeably with 'nanoelectronic circuit' and 'nano-scale circuit' or the respective circuit layer herein.

For the purposes of the various embodiments herein, it is irrelevant whether the nano-scale circuit is on a top or upper side, a bottom or lower side, or on a left side or a right side of the hybrid-scale circuit relative to the micro-scale circuit. Therefore, any reference herein to 'top', 'bottom', 'upper', 'lower', 'left' or 'right' with respect to the circuits is not intended to be a limitation herein. Moreover, the different-scale circuits are electrically isolated from one another except for the internal electrical connection according to the various embodiments herein. In some embodiments, the electrical isolation between the different-scale circuits is a nonconductive barrier or insulator layer that supports the electrical interconnect between the different circuit types in the hybrid-scale circuit.

In an embodiment of the present invention, a hybrid-scale electronic circuit having an internal electrical connection between different circuit types is provided. FIG. 1 illustrates a cross-sectional view of a hybrid-scale circuit 100 according to an embodiment of the present invention. The hybrid-scale circuit 100 comprises a conventional micro-scale circuit 110, a nano-scale circuit 130, and an insulator layer 120 between the circuits 110, 130. The insulator layer 120 physically separates and electrically isolates the circuits 110, 130 from one another. The hybrid-scale circuit 100 further comprises an interconnect 140 extending through the insulator layer 120. The interconnect 140 electrically connects the micro-scale circuit 110 and the nano-scale circuit 130 together. The micro-scale circuit 110 comprises a micro-scale electrical contact 112 and the nano-scale circuit 130 comprises a nano-scale electrical contact 132. The interconnect 140 connects to the respective electrical contacts 112, 132 of the different-scale circuits 110, 130 at opposite ends of the interconnect 140.

The interconnect 140 has a tapered shape according to various embodiments of the present invention. The tapered shape may be a generally conical shape or a generally pyramidal shape, for example and not by way of limitation. The interconnect 140 is compatible with the different circuit types by having a characteristic tapered shape. In some embodiments, the tapered interconnect 140 provides an electrical path having a reduced series resistance between the different circuits 110, 130 relative to using a conventional columnar interconnection, which by definition is not tapered, between the different circuits types. In some embodiments, the reduced series resistance is referred to as a 'low' series resistance; again relative to the conventional non-tapered interconnect between the different circuit types.

For example, the reduced series resistance is provided because the cross sectional area of the interconnect 140 is not limited to a single size that is compatible with only the nano-scale circuit 130 and that is smaller than sizes compatible with the micro-scale circuit 110. However, the cross sectional area of a conventional columnar interconnect is limited to a single size that is compatible with only the smaller of the different-scale circuits. In general, resistance (R) in an interconnect is a function of a cross sectional area and a length (i.e., R is proportional to length and inversely proportional to cross sectional area). A columnar nano-scale interconnect has a cross section that is of nano-scale dimension and thus, has a relatively high resistance for a given length. For the same length, a columnar micro-scale interconnect would exhibit a lower resistance compared to that of the columnar nano-scale interconnect. However, the columnar micro-scale interconnect would not be geometrically compatible with the nano-scale contact 132.

Moreover, the columnar nano-scale interconnect corresponds to a nano-scale dimension contact point at one end and is much smaller than a micro-scale dimension contact point at the other end, such that the ends of the columnar nano-scale interconnect essentially fits to (or within) both contact points. By contrast, a conventional columnar micro-scale interconnect does not correspond to or fit within the nano-scale contact point, since it is inherently much larger and would overhang the nano-scale contact point. Such an overhang is prone to create a short circuit to other nearby circuit components associated with the nano-scale circuit. As such, the tapered shape of the electrical interconnect 140 of the present invention provides a trade off between a targeted 'fit' at the nano-scale end with the columnar nano-scale interconnect and the lower resistance afforded by the larger cross sectional area associated with the columnar micro-scale interconnect.

To achieve the reduced resistance according to various embodiments herein, the tapered interconnect 140 has a taper angle defined by a first end that has a first end dimension that approximates a size of a contact region of the micro-scale circuit and a second or opposite end that approximates a size of a contact region of the nano-scale circuit and a distance between the first and second ends (i.e., an axial length of the interconnect 140). The term 'approximates' means 'comparable to' when used herein with reference to the end dimension of the tapered nanowire 140 and a size of a respective contact region. The first end is larger than the second end of the interconnect 140. The first or larger end of the interconnect 140 contacts the micro-scale circuit 110. The relatively smaller second end contacts the nano-scale circuit 130. As such, the tapered interconnect 140 is compatible with both the micro-scale circuit 110 and the nano-scale circuit 130.

FIG. 1 further illustrates that the micro-scale circuit 110 is in contact with the larger end of the interconnect 140 and the nano-scale circuit 130 is in contact with the relatively smaller end of the interconnect 140. Hereinafter, 'larger', 'much larger', 'wider' and 'much wider' may be used interchangeably with reference to the end dimension of the tapered nanowire 140 that approximates the micro-scale size of the contact region, for simplicity of discussion and not by way of limitation. In some embodiments, one end dimension of the interconnect 140 is a micro-scale dimension and the other end dimension of the interconnect 140 is a nano-scale dimension.

The hybrid-scale circuit 100 embodiment in FIG. 1 exemplifies a vertical stacked relationship between layers of the circuit, according to an embodiment of the present invention. For example, in FIG. 1, the insulator layer 120 is stacked on the micro-scale circuit 110 and the nano-scale circuit 130 is stacked on the insulator layer 120. Moreover, in the embodiment illustrated in FIG. 1, the interconnect 140 extends vertically relative to respective horizontal major planes of the circuit layers 110, 130.

The embodiment of the hybrid-scale circuit 100 illustrated in FIG. 1 is illustrative only. For example, a quantity of the various circuits 110, 130 in FIG. 1 may be varied and additional circuits of similar or different circuit types may be provided adjacent to the respective different circuits 110, 130 shown. Adjacent similar circuit types may be interconnected electrically with conventional columnar interconnects. Moreover, while only one interconnect 140 is shown, a plurality of interconnects 140 may connect different portions of the different circuits 110, 130, for example. These and other embodiments that may be devised by a skilled artisan are all within the scope of the various embodiments of the present invention. The description herein emphasizes the vertical, stacked hybrid-scale circuit embodiment of FIG. 1 for simplicity of discussion and not by way of limitation.

In some embodiments of the hybrid-scale circuit 100, the interconnect 140 is a nanowire having an axial length with a tapered cross section along the axial length (i.e., 'tapered shape'). The nanowire is surrounded by the insulator layer 120. In some embodiments, the nanowire is either made of an electrically conductive nanowire material or made of a semiconductor nanowire material that is rendered electrically conductive by an introduction of a dopant in the nanowire. In other embodiments, the nanowire may be made of a nonconductive material to which an electrically conductive coating is applied to obtain a low resistance electrical connection. The nanowire extends from the electrical contact 112, 132 on one of the circuits 110, 130, through the insulator layer 120, to the electrical contact 132, 112 on the other of the circuits 130, 110. In some embodiments, the nanowire is grown from a surface of the electrical contact 112, 132 of one of the circuits 110, 130 and embedded in a deposited insulator material, which is further described below.

In other embodiments, the interconnect 140 is a via or hole with a tapered shape (i.e., the cross-section of the via tapers along an axial length of the via) through the insulator layer 120. The via interconnect 140 is filled with a filler material that is either electrically conductive or rendered electrically conductive, as mentioned above for the nanowire interconnect 140. The via interconnect 140 extends from the electrical contact 112, 132 on one of the circuits 110, 130, through the insulator layer 120, to the electrical contact 132, 112 on the other circuit 130, 110. In some embodiments, the via is etched into a deposited insulator layer 120 using etching techniques, and filled using deposition techniques, both of which are described further below.

Both the conventional circuit and nano-scale circuit comprise one or more materials including, but not limited to, a semiconductor material from group IV of the Periodic Table of the Elements; compound semiconductors from group IV; compound semiconductors from groups III/V; and compound semiconductors from groups II/VI. For example, and not by way of limitation, the different circuits may independently comprise any one or more of silicon (Si), germanium (Ge), gallium arsenide (GaAs) and cadmium sulfide (CdS).

The contact region of the different circuit types is a material including, but not limited to, polysilicon that is rendered electrically conductive by doping and an electrically conductive material including, but not limited to, aluminum (Al), copper (Cu), titanium (Ti) silicides and cobalt (Co) silicides and less frequently, gold (Au). In some embodiments, when copper is used for an electrically conductive region in the circuit, a barrier metal is deposited beneath the copper layer to reduce effects of possible copper migration, for example. Barrier metals including, but not limited to, one or more of tungsten (W) and titanium (Ti), may be used with copper to reduce migration.

The insulator layer 120 comprises an electrically nonconductive material including, but not limited to, silicon dioxide ($SiO_2$), silicon nitride ($Si_3N_4$), carbon-containing silicon oxide, and low-permittivity organics. The interconnect 140 material includes, but is not limited to, one or more of the semiconductor materials and electrically conductive materials provided herein.

In some embodiments, the different circuit types 110, 130 may be referred to as a 'first' circuit 110, 130 and a 'second' circuit 110, 130, without distinction as to which is the micro-scale or conventional circuit type and which is the nano-scale circuit type. Reference to 'first' and 'second' herein is not intended to imply any sequence of fabrication steps of the hybrid-scale circuit 100 with respect to the micro-scale circuit and the nano-scale circuit, unless otherwise specifically indicated. Either circuit type may be fabricated first, and may depend on the embodiment, as will be further described below.

Figure 2:
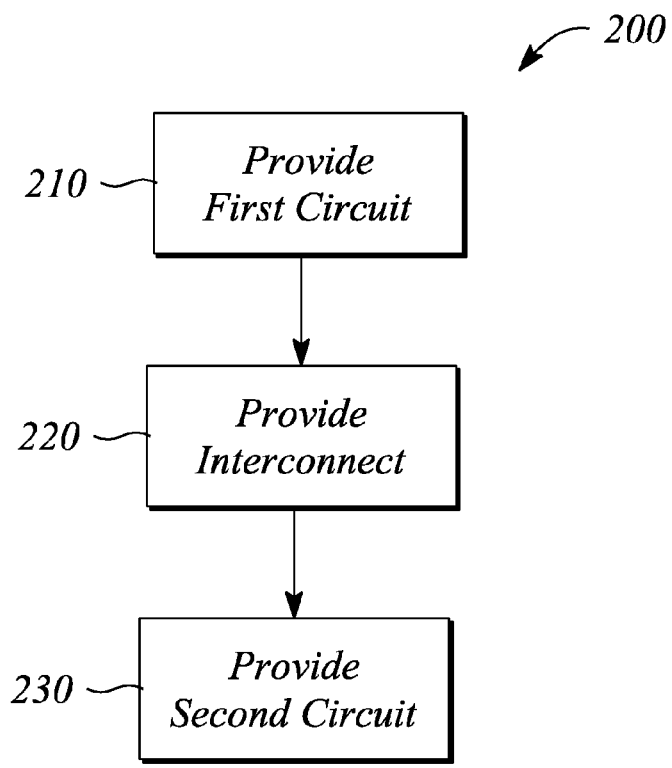
FIG. 2 illustrates a block diagram of a method of electrically interconnecting different-scale circuit layers of a hybrid-scale electronic circuit according to an embodiment of the present invention.

In another embodiment of the present invention, a method of electrically interconnecting different circuit types in a hybrid-scale circuit is provided. FIG. 2 illustrates a block diagram of a method 200 of electrically interconnecting different-scale circuit layers of a hybrid-scale electronic circuit according to an embodiment of the present invention. The method 200 comprises providing 210 a first circuit layer and providing 220 an interconnect. The interconnect is surrounded by an insulator layer deposited on the first circuit layer during providing 220 an interconnect. The method 200 further comprises providing 230 a second circuit layer on the insulator layer in contact with the provided 220 interconnect. One of the first circuit layer and the second circuit layer is a conventional, micro-scale circuit; another of the first and second circuit layers is a nano-scale circuit, as defined herein. The provided 220 interconnect electrically connects between the different-scale circuit layers. The interconnect has a tapered shape, such that a dimension of one end of the interconnect is larger than a corresponding dimension of an opposite end. The larger-dimensioned end is compatible with and makes contact with the conventional micro-scale circuit. The relatively smaller-dimensioned end is compatible with and makes contact with the nano-scale circuit. The compatibility provided by the tapered interconnect is realized by one or more of a better match of each end of the interconnect to respective-scaled contact regions of the different-scale circuits and a reduction in series resistance between the different-scale circuits relative to a columnar (i.e., non-tapered) conventional connector used to connect the different-scale circuits, as further described above.

In some embodiments, the conventional micro-scale circuit is provided 210 first, then the interconnect is provided 220 by forming the interconnect on the micro-scale circuit. Moreover, the nano-scale circuit is provided 230 after the interconnect is provided 220. However, it is within the scope of the invention to have an alternative embodiment wherein the nano-scale circuit is provided 230 first, then the interconnect is provided 220 by forming the interconnect on the nano-scale circuit before the micro-scale circuit is provided 210. The method 200 is described herein for the embodiments wherein the sequence of method steps is in the illustrated numerical order in FIG. 2 for the purpose of simplicity of discussion herein.

As such, the provided 210 first circuit layer is the conventional-scale circuit and the provided 230 second circuit layer is the nano-scale circuit. The conventional-scale circuit is provided 210 using any conventional fabrication techniques and materials for integrated circuit fabrication. For example, the materials listed above for the conventional-scale circuit 110 of the hybrid-scale circuit 100 may be used to fabricate conventional-scale circuitry. Techniques including, but not limited to, photolithography, ion implantation, various chemical vapor deposition (CVD) techniques, sputtering, evaporation, wet etching and dry etching, for example, may be used to provide 210 the conventional-scale circuit (i.e., micro-scale circuit). The nano-scale circuit is provided 230 using any of the materials and fabrication techniques mentioned herein for the conventional-scale circuit fabrication, and further includes, but is not limited to, nano-imprint lithography (NIL). The provided 220 interconnect may use any of the materials described herein for the interconnect 140 of the hybrid-scale electronic circuit 100.

In some embodiments, providing 220 an interconnect comprises growing a nanowire from a location on an electrical contact of the conventional micro-scale circuit and forming an insulator layer that surrounds the interconnect. The nanowire is grown with a tapered shape, as described above. FIG. 3A-3F illustrate cross-sectional views of various stages of the fabrication 300 of a nanowire interconnect 340 for a hybrid-scale electronic circuit according to an embodiment of the present invention. In some embodiments, the nanowire interconnect 340 and the hybrid-scale circuit are essentially the same as the nanowire interconnect 140 embodiment and the hybrid-scale electronic circuit 100 that are described above.

Figure 3A:
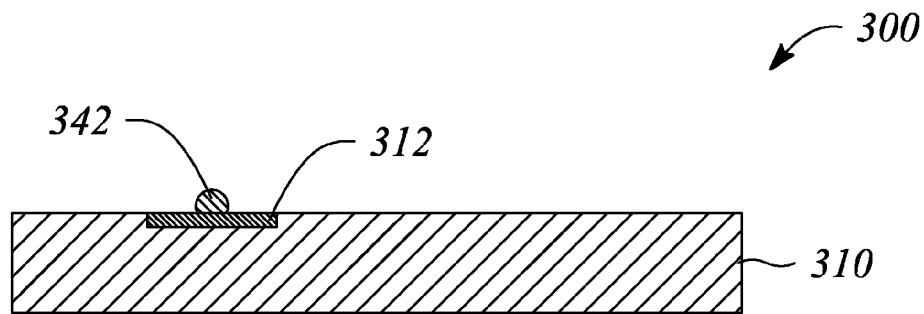
FIGS. 3A-3F illustrate cross-sectional views of various stages of fabrication of a nanowire interconnect for a hybrid-scale electronic circuit according to an embodiment of the present invention.

FIG. 3A illustrates a cross-sectional view of a micro-scale circuit 310 comprising an electrical contact 312 on or in a surface of the micro-scale circuit 310 according to an embodiment of the present invention. The electrical contact 312 has a micro-scale dimension. In some embodiments, the micro-scale circuit 310 and the respective electrical contact 312 are equivalent to the conventional micro-scale circuit 110 and the electrical contact 112 that are described above for the hybrid-scale circuit 100.

Nanowires are grown using a variety of techniques including, but not limited to, catalytic growth using vapor-liquid-solid (VLS) growth, catalytic growth using solution-liquid-solid (SLS) growth, and non-catalytic growth using vapor-phase epitaxy. Catalytic growth is further characterized by being either metal catalyzed or nonmetal catalyzed. The growth is performed in a chemical vapor deposition (CVD) chamber in a controlled environment using a gas mixture comprising nanowire precursor materials. During catalytic growth, nanowires grow in a predominately perpendicular direction from a plane of the substrate surface with a suitable crystal orientation. For horizontal substrate surfaces, such as those illustrated in FIGS. 3A-3F, a nanowire will grow predominately vertically relative to the horizontal surface. On vertical substrate surfaces, a nanowire will grow predominately horizontally from the vertical surface.

Figure 3B:
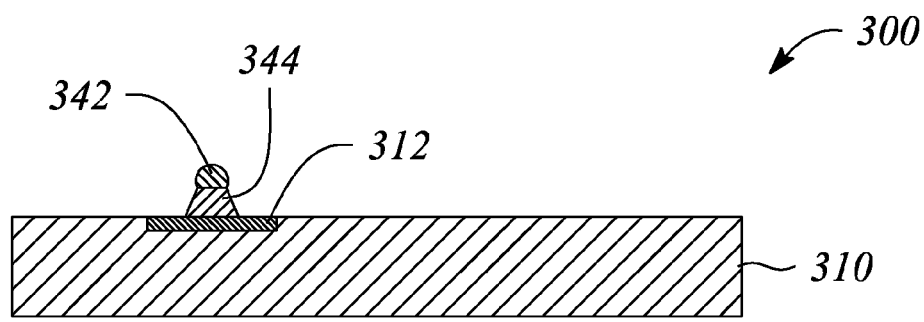

In catalyzed growth, the nanowire essentially grows axially from a surface using a nucleating nanoparticle catalyst. FIG. 3A further illustrates a cross-sectional view of the nanoparticle catalyst 342 on the electrical contact 312 of the micro-scale circuit 310 during fabrication 300, according to an embodiment of the present invention. For the purposes of the various embodiments of the present invention, the nanowire interconnect is grown using a combination of catalyzed growth and uncatalyzed growth to achieve the tapered shape of the nanowire interconnect. As catalyzed growth of the nanowire commences in the axial direction, uncatalyzed deposition of nanowire material takes place on the sidewall surface of the nanowire in the radial direction. In uncatalyzed growth, the nanowire essentially grows at a lower rate, which is determined by the decomposition of the precursor materials in the gas mixture, on a surface of the depositing nanowire material (i.e., sidewall surface), as further described below. This uncatalyzed rate is lower than the catalyzed rate. FIG. 3B illustrates a cross-sectional view of nanowire 344 growth commenced on a surface of the electrical contact 312 of the micro-scale circuit 310 during fabrication 300 according to an embodiment of the present invention.

Before nanowire growth is commenced, a nanoparticle catalyst is formed on a surface of the electrical contact. In some embodiments, the nanoparticle is formed by masking the surface of the micro-scale circuit and patterning the masked surface to expose a portion of the electrical contact. Masking a surface and patterning a mask uses materials and methods including, but not limited to, one or more of photolithography, nano-imprint lithography, and etching. In some embodiments, a nucleation layer of a catalyst material is deposited on the patterned mask surface by electron-beam evaporation, for example. In some of these embodiments, the catalyst material is removed from areas surrounding the exposed electrical contact by a lift-off process with the removal of the patterned mask or by selective etching, for example and not by way of limitation. In other embodiments, a metal catalyst material is deposited using electrochemical deposition, such as electroless deposition, using a deposition solution comprising a salt of the metal catalyst material. Using electroless deposition, the catalyst material preferentially deposits as metal nanocrystals on the exposed region of the electrical contact instead of on the patterned mask.

Typical catalyst materials are metals and nonmetals. Metal catalyst materials include, but are not limited to, titanium (Ti), platinum (Pt), nickel (Ni), gold (Au), gallium (Ga), and alloys thereof. Nonmetal catalyst materials include, but are not limited to, silicon oxide ($SiO_x$), where x ranges from about 1 to less than 2, for example. Typical nanoparticle catalysts corresponding to Ti and Au catalyst materials, for example, are respectively titanium silicide ($TiSi_2$) and gold-silicon (Au—Si) alloy. For the reason mentioned above, Au is less desirable as a catalyst material for the hybrid-scale electronic circuit of the present invention.

In some embodiments, the deposited catalyst material is annealed into an activated nanoparticle catalyst on the electrical contact. In other embodiments, the catalyst material is a nanoparticle catalyst deposited in an activated, nucleating form on the electrical contact and therefore, annealing is optional. For example, annealing removes any surface contaminates that may be present on the surface of the circuit layer.

In some embodiments, the patterned mask is selectively removed from the surface of the micro-scale circuit while leaving the nanoparticle catalyst intact on the electrical contact. Patterned mask removal uses methods including, but not limited to, exposure to solvents, dry etching techniques, such as reactive ion etching (RIE), plasma etching and ion milling, and wet chemical etching techniques, for example. In other embodiments, the patterned mask is not removed and becomes part of a subsequently formed insulator layer, as further described below.

Nanowire growth is initiated in the CVD reaction chamber using both the nanoparticle catalyst from the surface of the electrical contact and the gas mixture of the nanowire precursor material that is introduced into the chamber at a growth temperature. The activated or nucleating nanoparticle catalyst accelerates decomposition of the nanowire precursor material in the gas mixture, such that adatoms resulting from decomposition of a particular gas containing a nanowire-forming material diffuse through or around the nanoparticle catalyst, and the adatoms precipitate on the underlying substrate. In particular, the adatoms of the nanowire material precipitate between the nanoparticle catalyst and the surface of the electrical contact of the micro-scale circuit layer to initiate nanowire growth. Moreover, catalyzed growth of the nanowire is continued with continued precipitation at the nanoparticle-nanowire interface. Such continued precipitation causes the nanoparticle to remain at the tip of the free end of the growing nanowire. As illustrated in FIG. 3B, the nanowire 344 grows with the nanoparticle catalyst 342 on the free end thereof in a direction that is predominately perpendicular to the horizontal surface of the micro-scale circuit 310 from a location on the electrical contact 312 where the nanoparticle catalyst 342 was formed. Moreover, additional nanowire material deposits on the nanowire surface (uncatalyzed growth or deposition), according to various embodiments herein, to initiate a generally conical or tapered shape to the nanowire 344.

As such, providing 220 an interconnect having a tapered shape by growing a nanowire comprises using a combination of catalyzed nanowire growth and uncatalyzed nanowire growth. In particular, new nanowire growth is catalyzed growth that is adjacent to the nanoparticle catalyst 342, while old nanowire growth is an existing portion of the growing nanowire adjacent to the electrical contact 312. During continued nanowire growth, the existing portion of the nanowire that has already grown (i.e., the 'old' growth) continues to receive additional nanowire material from the gas mixture on a surface of the existing nanowire portion by uncatalyzed deposition. In effect, a first end of the initiated growing nanowire 344, which is adjacent to the electrical contact 312, accrues more nanowire material during nanowire growth with time due to uncatalyzed deposition than does a second or free end of the initiated growing nanowire 344, which is adjacent to the nanoparticle catalyst 342, because of the longer exposure time of the first end of the nanowire to the nanowire precursor material in the gas mixture. Thus, a nanowire with a tapered shape results.

Figure 3C:
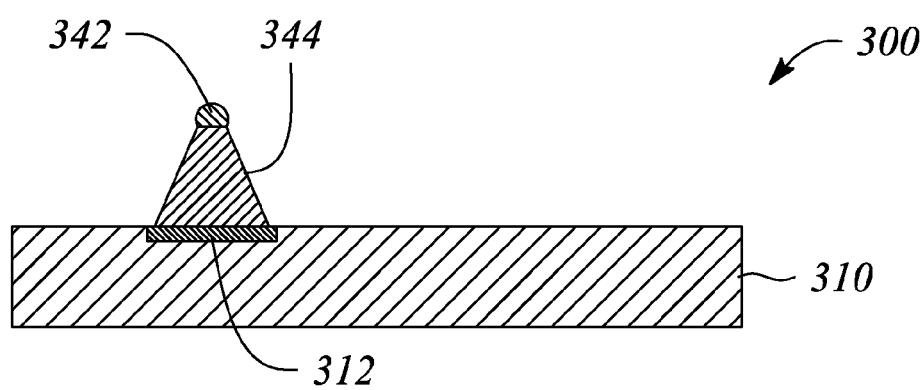

FIG. 3C illustrates a cross-sectional view of the nanowire 344 with the nanoparticle catalyst 342 on the free end thereof after nanowire growth is complete during fabrication 300 of the nanowire interconnect, according to an embodiment of the present invention. In this embodiment, the first end of the nanowire 344 adjacent to the micro-scale circuit 310 has a dimension that approximates the micro-scale dimension of the electrical contact 312, which is larger than a dimension of the second or free end.

According to various embodiment of the present invention, a targeted angle of taper for the growing nanowire 344 is achieved and maintained during nanowire growth. The targeted taper angle is achieved using a gas mixture that comprises a nanowire precursor material gas and a regulating gas at a nanowire growth temperature. The regulating gas regulates an uncatalyzed deposition rate of the nanowire material on the grown portion of the growing nanowire 344. In some embodiments, the regulating gas reduces the angle of taper by reducing the uncatalyzed deposition rate while only minimally affecting the axial growth rate. Therefore, the gas mixture comprises a ratio of the regulating gas to the nanowire precursor material gas that achieves the targeted taper angle of the growing nanowire 344. Moreover, the ratio of gases in the gas mixture remains constant during nanowire growth to achieve a constant angle of taper. The angle of taper remains constant because the constant ratio of gases in the gas mixture and a constant nanowire growth temperature provide a constant ratio of the uncatalyzed deposition rate to a catalyzed growth rate.

For example, a tapered nanowire of silicon is grown, according to some embodiments of the present invention, from a gas mixture comprising silane ($SiH_4$) gas as the nanowire precursor material in a hydrogen ($H_2$) gas ambient and hydrogen chloride (HCl) gas as the regulating gas at nanowire growth temperature to control the angle of taper. HCl gas is an effective regulator of uncatalyzed deposition of silicon on the grown portion of a growing silicon nanowire. A gas mixture of silane gas in an $H_2$ gas ambient with HCl gas is a gas mixture for growing columnar or non-tapered silicon nanowires, for example. However, for the purposes of the various embodiments of the present invention, the amount of the HCl regulating gas in the gas mixture is less than an amount of the HCl gas used in the gas mixture that achieves the columnar silicon nanowire, for the same amount of silane gas therein. As such, a targeted taper angle for the growing silicon nanowire is achieved with a constant ratio of the silane nanowire precursor gas to the HCl regulator gas that is different from a gas mixture ratio used to grow a columnar silicon nanowire. By definition, the tapered nanowire 344 has an angle of taper, such that the grown nanowire 344 comprises a first end adjacent to the micro-scale circuit 310, which approximates the micro-scale dimension of the electrical contact 312, wherein the taper decreases along its axial length to a relatively smaller second end, as illustrated in FIG. 3C.

Other nanowire materials may be used to grow a tapered nanowire according to the various embodiments of the present invention using the constant ratio of uncatalyzed deposition rate to catalyzed growth rate, as described above, for the respective other nanowire material. For example, nanowire materials including, but not limited to, germanium (Ge), gallium arsenide GaAs and indium phosphide are nanowire materials that can be grown with a tapered shape, as described herein, using corresponding precursor and regulating gas mixtures thereof and the appropriate ranges of deposition parameters known from the literature to be appropriate for the respective materials being deposited. Moreover, a tapered heterogeneous nanowire having axial segments of different nanowire materials along the axial length thereof is within the scope of the various embodiments of the present invention.

In specific examples, silicon nanowires were grown with a variety of constant taper angles. In some of the examples, the silicon nanowires were grown in a CVD reaction chamber using a $TiSi_2$ nanoparticle catalyst and a gas mixture comprising about 15 standard cubic centimeter per minute (sccm) $SiH_4$ gas in about 3 standard liter per minute (slm) $H_2$ gas and a total pressure of 10 torr. A constant amount of HCl regulating gas, ranging from about 45 sccm HCl gas to about 15 sccm HCl gas, depending on the example, was introduced into the CVD chamber to mix with the gas mixture. The constant amount of the HCl gas was introduced to regulate the uncatalyzed growth or deposition rate and to control the nanowire taper. Some of these examples used a constant temperature of one of 640 degrees centigrade (° C.), 680° C. and 720° C. The taper of the silicon nanowire was increased (increased cross-section) with one or both of the lower amount HCl regulating gas added in the gas phase and the higher temperature.

Both the catalyzed growth rate and the uncatalyzed growth rate are dependent on temperature as well as on a fraction of the regulating gas in the gas phase. As such, the temperature also facilitates control over the taper angle to shape the growing nanowire. For example, assuming a ratio of $SiH_4$/HCl gases in the gas mixture is the same at two different temperatures, the nanowire taper would be greater (e.g., wider cross-section near the bottom) at a higher one of the different temperatures, since the uncatalyzed deposition rate is a greater function of temperature than the catalyzed growth rate (e.g., activation energies are about 2.3 electron Volts (eV) and about 0.83 eV for uncatalyzed deposition rate and catalyzed growth rate, respectively). However, the temperature in the CVD reaction chamber and the ratio of precursor to regulating gases also may be manipulated during nanowire growth to change a degree of taper, such that the nanowire can have a variable angle of taper along the axial length thereof, for example. As such, it is within the scope of the present invention to have embodiments wherein one or both of temperature and the ratio of gases in the gas mixture is manipulated during nanowire growth to achieve a nanowire shape having other than a constant angle of taper.

In some embodiments, the nanowire is rendered electrically conductive by adding a dopant in a gas phase, such as boron or phosphorus, to the gas mixture in the CVD chamber during nanowire growth. For example, gaseous diborane ($B_2H_6$) or phosphine ($PH_3$) is added to the above-mentioned $SiH_4$/HCl/$H_2$ gas mixture for tapered growth to achieve a level of electrical conductivity. In some embodiments, the nanowire is rendered electrically conductive by adding one or more dopants after the nanowire is grown using ion implantation or gas-phase diffusion, for example. In other embodiments, the nanowire is coated with an electrically conductive material. In some embodiments, the nanowire material is a metal material that is inherently electrically conductive.

Figure 3D:
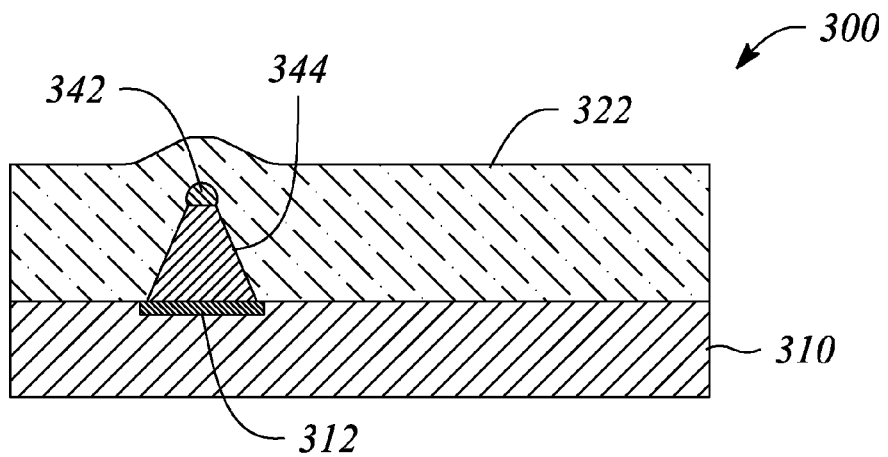

After the nanowire 344 is grown, an insulator layer is formed around the nanowire 344. The insulator layer provides support to the nanowire 344 as well as providing insulation between the first circuit layer and the second circuit layer. The insulator layer is formed comprising covering the grown nanowire 344 with an insulator material 322. In some embodiments, the insulator material 322 is provided on a surface of the micro-scale circuit 310 to cover the surface and the grown nanowire 344. The insulator material 322 is deposited as a blanket layer covering not only the surface of the micro-scale circuit 310, but also covering the grown nanowire 344, for example and not by way of limitation. FIG. 3D illustrates a cross-sectional view of the provided insulator material 322 over the grown nanowire 344 and the surface of the micro-scale circuit 310 during fabrication 300, according to an embodiment of the present invention.

Figure 3E:
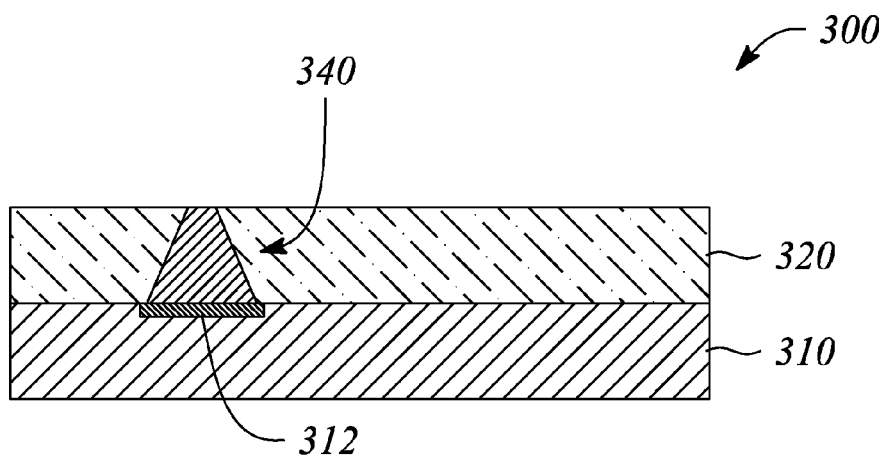

According to these embodiments, forming an insulator layer further comprises planarizing a surface of the provided insulator material 322 so that a surface of the opposite end of a nanowire interconnect 340 is exposed through a planar surface of a formed insulator layer 320. FIG. 3E illustrates a cross-sectional view of the planar insulator layer 320 and the exposed end surface of the nanowire interconnect 340 during fabrication 300, according to an embodiment of the present invention. A top surface of the planar insulator layer 320 is coplanar with the exposed end of the nanowire interconnect 340 and a bottom surface of the planar insulator layer 320 is coplanar with the micro-scale circuit 310, for example. In some embodiments, chemical mechanical polishing (CMP) is used to render the insulator layer 320 planar and provide the exposed end surface of the nanowire interconnect 340, for example and not by way of limitation. The surface of the insulator layer 320 may optionally be recessed slightly by selective chemical etching to expose a surface of the nanowire interconnect 340 near its exposed end for improved subsequent electrical connection.

Figure 3F:
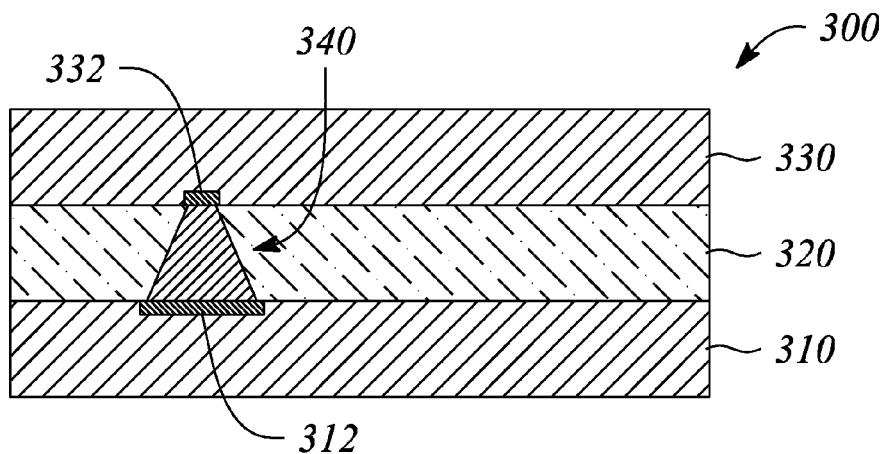

After the nanowire interconnect is provided 220 according to the method 200 illustrated in FIG. 2, the second circuit layer is provided 230 on the planar insulator layer to connect with the exposed end surface of the nanowire interconnect. FIG. 3F illustrates a cross-sectional view of a nano-scale circuit 330 on the insulator layer 320 during fabrication 300, such that the nanowire interconnect 340 interconnects between the micro-scale circuit 310 and the nano-scale circuit 330, according to an embodiment of the present invention. The nano-scale circuit 330 comprises an electrical contact 332 on or in a surface of the nano-scale circuit 330. The electrical contact 332 contacts with the exposed end surface of the nanowire interconnect 340.

During nanowire growth, the nanoparticle catalyst 342 is carried by the growing nanowire 344 on the free or opposite end (see FIGS. 3B-3D, for example). In some embodiments, planarizing to expose the end surface of the nanowire connector 340 actually exposes the nanoparticle catalyst 342 (not illustrated) that is on the free end of the nanowire 344. In some of these embodiments, the electrical contact 332 of the nano-scale circuit 330 comprises the nanoparticle catalyst 342.

The nano-scale circuit 330 is provided 230 on the exposed surface of the insulator layer 320 using suitable fabrication methods, such as those mentioned above, and others including, but not limited to, NIL. In some embodiments, the insulator layer 320 essentially passivates and protects the micro-scale circuit layer 310 from the fabrication steps used for providing 230 the nano-scale circuit 330.

Figure 4A:
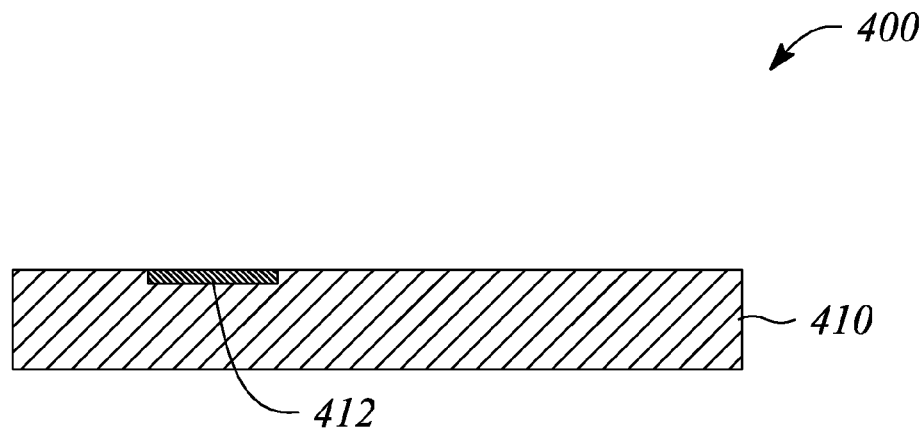
FIGS. 4A-4H illustrate cross-sectional views of various stages of fabrication of a via interconnect for a hybrid-scale electronic circuit according to another embodiment of the present invention.

In other embodiments of providing 220 an interconnect, the interconnect is a tapered via interconnect that connects between the different-scale circuits. In these embodiments, providing 220 an interconnect comprises forming an electrically conductive via having a tapered shape in an insulator layer on the first circuit layer. FIGS. 4A-4H illustrate cross-sectional views of various stages of fabrication 400 of a via interconnect 440 for a hybrid-scale electronic circuit, according to another embodiment of the present invention. In some embodiments, the via interconnect 440 and the hybrid-scale electronic circuit are essentially the same as the via interconnect 140 embodiment and the hybrid-scale electronic circuit 100 that are described above. FIG. 4A illustrates a cross-sectional view of a conventional micro-scale circuit layer 410 of the hybrid-scale circuit provided 210 during fabrication 400, according to an embodiment of the present invention. The micro-scale circuit layer 410 comprises an electrical contact 412 on or in a surface of the conventional-scale circuit layer 410.

Figure 4B:
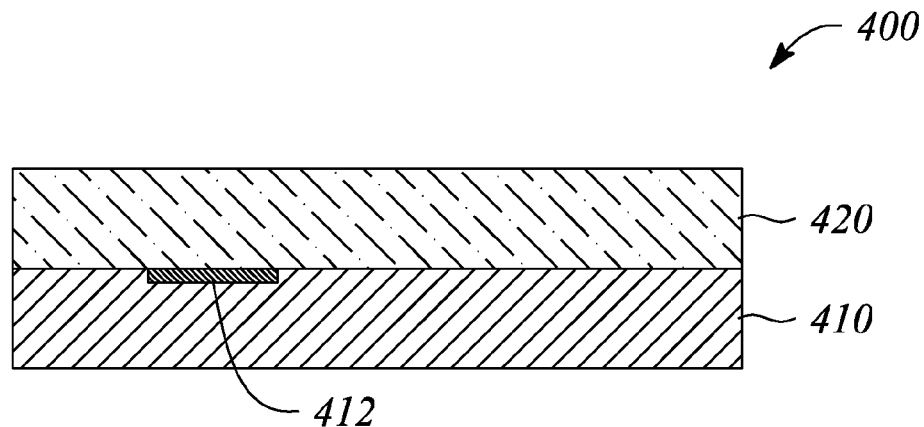
Figure 4C:
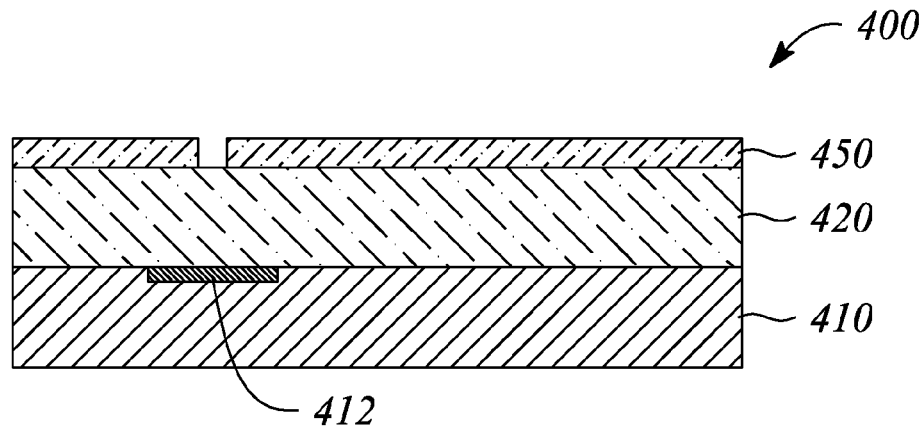

Forming an electrically conductive tapered via comprises providing an insulator layer 420 on a surface of the conventional-scale circuit layer 410 and masking a surface of the insulator layer 420 to provide a patterned mask 450 on the insulator layer 420. In some embodiments, the insulator layer 420 is provided to the surface of the conventional-scale circuit 410 using material deposition techniques, for example and not by way of limitation. FIG. 4B illustrates a cross-sectional view of the insulator layer 420 provided on the conventional-scale circuit 410 during fabrication 400, according to an embodiment of the present invention. In some embodiments, the surface of the insulator layer 420 is masked and patterned using one or both of photolithography and NIL, for example and not by way of limitation. FIG. 4C illustrates a cross-sectional view of the patterned mask 450 on the insulator layer 420 during fabrication 400, according to an embodiment of the present invention. The patterned mask 450 exposes the surface of the insulator layer 420 at a position above the electrical contact 412 on the conventional-scale circuit layer 410.

Forming an electrically conductive tapered via further comprises etching the insulator layer 420 at the exposed position using directional etching (i.e., angled etching). In some embodiments, etching the insulator layer 420 comprises using etching techniques including, but not limited to, reactive ion etching (RIE) and ion milling, or a combination thereof, for example and not by way of limitation. For example, RIE is a specialized plasma dry chemical process that achieves material removal anisotropically. In another example, ion milling is a form of ion beam dry chemical processing that is inherently anisotropic. Directional etching of the insulator layer 420 at the exposed position forms a targeted angle of taper for the tapered via.

Figure 4D:
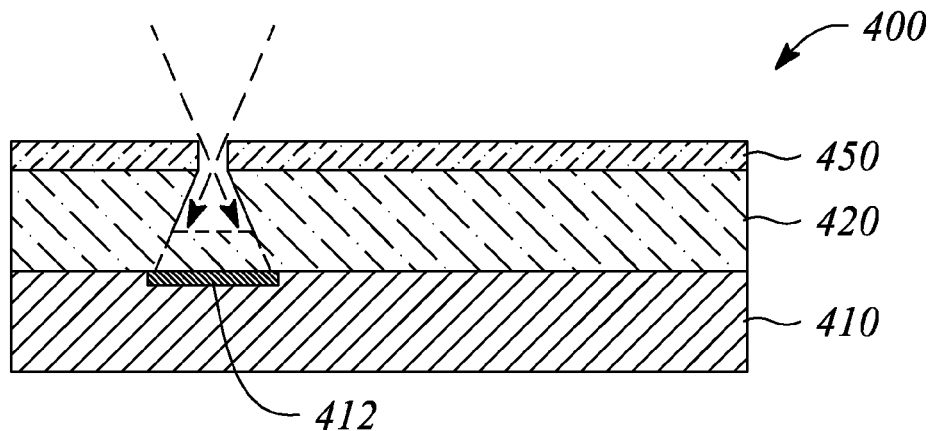

FIG. 4D illustrates a cross-sectional view of the insulator layer 420 being angled etched during fabrication 400, according to an embodiment of the present invention. In this embodiment, the angled etching technique undercuts the mask opening, such that the insulator layer 420 is etched more in the x and y directions with increasing distance in the z direction from the mask opening (x, y and z directions being of a typical Cartesian coordinate system).

Figure 4E:
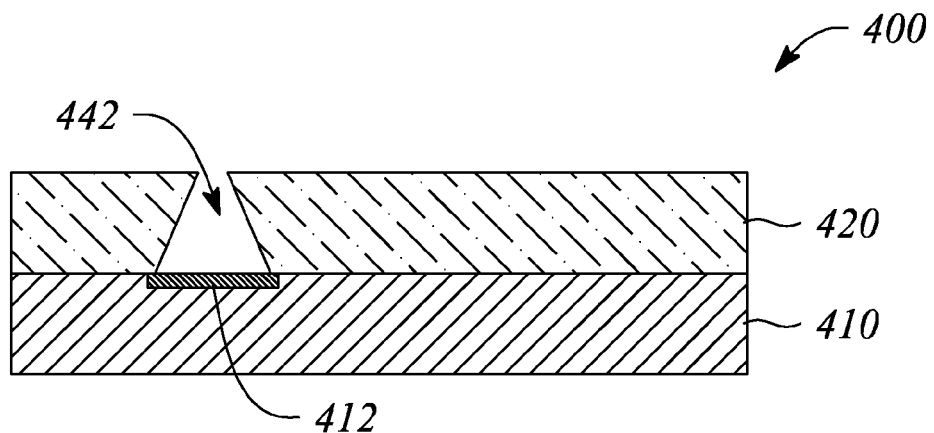

Angled etching of the insulator layer 420 through the patterned mask 450 provides a tapered via 442 through the insulator layer 420 that exposes the surface of the conventional-scale circuit 410 at the location of the electrical contact 412. FIG. 4E illustrates a cross-sectional view of the formed via 442 in the insulator layer 420 adjacent to the electrical contact 412 of the conventional-scale circuit 410 after completion of angled etching during fabrication 400, according to an embodiment of the present invention. The via 442 has a first end adjacent to the conventional-scale circuit layer 410 (exposing the electrical contact 412) with an end dimension that is larger than the end dimension at an opposite or second end adjacent to the patterned mask 450. The first end of the via 442 is also referred to herein as the 'bottom' of the via, for simplicity of discussion only. Similarly, the second end of the via 442 is also referred to herein as the 'top' of the via for simplicity of discussion only. The bottom of the via 442 has an end that approximates the micro-scale dimension of the electrical contact 412 of the conventional-scale circuit 410 (i.e., the bottom end dimension is comparable to a micro-scale dimension), while the top has an end that approximates a nano-scale dimension of nano-scale circuitry (i.e., the top end dimension either is comparable to a nano-scale dimension).

The patterned mask 450 is optionally removed once the via 442 is formed through the insulator layer 420, as illustrated in FIG. 4E. In some embodiments, the patterned mask 450 is removed from the surface of the insulator layer 420 using one or more of exposure to a solvent, CMP and an etching technique.

Forming an electrically conductive tapered via further comprises filling the via 442 with an electrically conductive filler material 444. In some embodiments, the filler material 444 is an inherently electrically conductive material. In other embodiments, the filler material 444 is a semiconductor material that is rendered electrically conductive by adding a dopant to the filler material. The filler material is rendered electrically conductive one or both of during deposition and after deposition, for example.

In some embodiments, filling the via 442 comprises selectively depositing the filler material 444 primarily on the bottom of the via, such that the deposited filler material 444 accumulates on itself at the via bottom, builds up and fills in along the internal sides of the via until it reaches the top of the via. In effect, the selective deposition reduces direct deposition on internal sidewalls of the via 442. In some embodiments, the selective deposition minimizes direct deposition on the sidewalls of the via 442. In some embodiments, reducing deposition of the filler material 444 on the internal sidewalls of the via will reduce a chance that the narrow via end or opening will close or be blocked (e.g., clog) with filler material 444 before the via is filled.

Figure 4F:
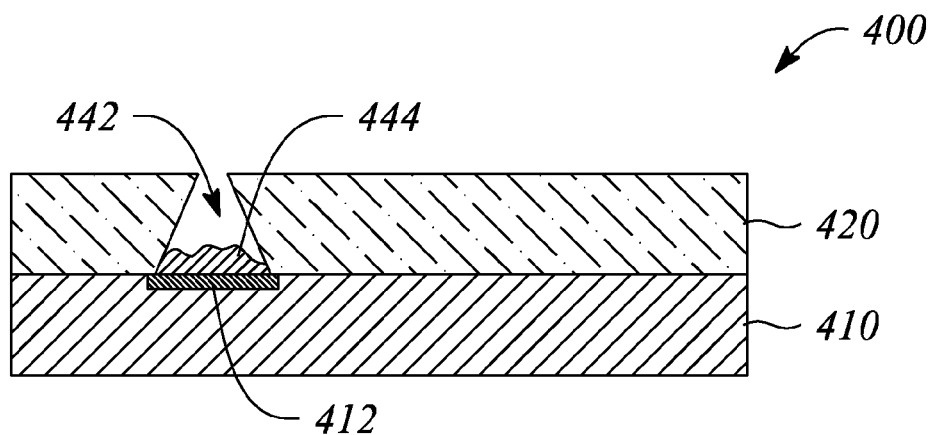

FIG. 4F illustrates a cross-sectional view of the via 442 partially filled from the bottom with the filler material 444 during fabrication 400, according to an embodiment of the present invention. In some embodiments, a selective deposition technique comprises a selective CVD growth process, wherein the selective CVD growth process will preferentially grow a layer of material on a similar material instead of on a dissimilar material. By 'similar material' herein, it is meant that the similar materials are both conductors, for example, as opposed to a conductor and an insulator material. The similar materials need not be the same material. For example, a metal material will selectively deposit on highly doped polysilicon (e.g., both are conductors) rather than on $SiO_2$. Moreover, highly doped polysilicon can be made to selectively deposit on a metal material rather than on $SiO_2$. For example, chlorine can be added to make this deposition process selective (e.g., add chlorine either from HCl gas or use a chlorine-containing Si precursor gas). For the purposes of the embodiments herein, the electrical contact 412 material and the filler material 444 are similar materials, such as metals or highly doped semiconductor materials, while the sidewalls of the via 442 are made of the insulator layer 420 material, such as an oxide material or a nitride material. As such, the CVD growth process will preferentially grow a layer of the filler material 444 on the material of the electrical contact 412 and on itself instead of on the sidewalls of the via 442.

Figure 4G:
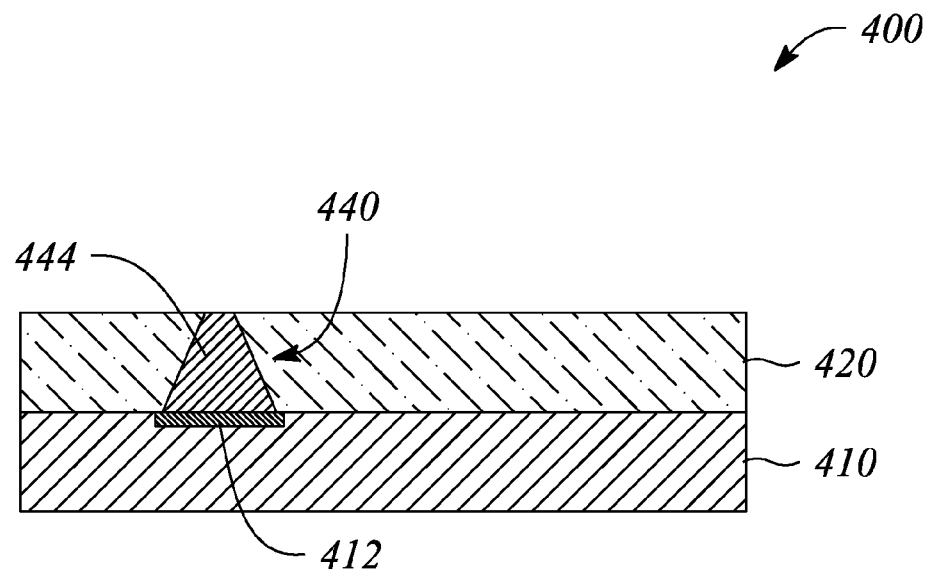

FIG. 4G illustrates a cross-sectional view of a tapered via interconnect 440 during fabrication 400, according to an embodiment of the present invention. The tapered via interconnect 440 is the via 442 of FIG. 4F filled with the filler material 444. In FIG. 4G, the tapered via interconnect 440 is coplanar with the surface of the insulator layer 420. As a result, the tapered via interconnect 440 having an exposed end surface that is coplanar with the insulator layer 420 is ready to receive a nano-scale circuit layer 430 during providing 230 a second circuit layer of the method 200.

However, in some embodiments, the filler material 444 overfills the via 442 during deposition, such that the filler material spills out of the via opening onto the surface of the insulator layer 420. In these embodiments, excess filler material 444 is removed from the surface of the insulator layer 420 to render the surface of the insulator layer 420 coplanar or level with the filler material 444 in the via 442. In other embodiments, the filler material 444 underfills the via 442 during deposition, such that the filler material 444 does not reach the surface of the insulator layer 420 in the via 442. In these embodiments, some material of the insulator layer 420 is removed to make the surface of the insulator layer 420 coplanar or level with the filler material 444 in the via 442. As such, in some embodiments, one or both of some filler material 444 and some insulator layer 420 material is removed depending on whether the via 442 is underfilled or overfilled, as described above. In some embodiments, the material is removed using a planarization technique including, but not limited to, CMP.

Figure 4H:
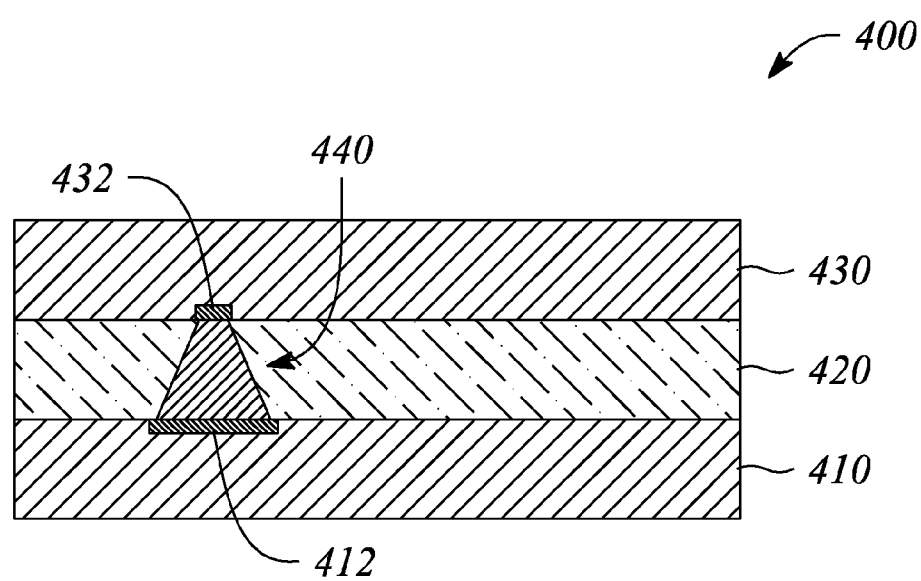

FIG. 4H illustrates a cross-sectional view of the nano-scale circuit 430 provided 230 on the planar surface of the insulator layer 420 during fabrication 400 according to an embodiment of the present invention. The nano-scale circuit 430 comprises an electrical contact 432 that physically and electrically connects with the exposed end of the via interconnect 440. As a result, the nano-scale circuit layer 430 is electrically connected to the conventional-scale circuit layer 410 by way of the via interconnect 440. The nano-scale circuit 430 is provided on the insulator layer 420 in much the same way as described above for providing the nano-scale circuit 330 on the insulator layer 320. The tapered via interconnect 440 provides an internal electrical connection between the different-scale circuits 410, 430 that has one or both of a low series resistance and improved electrical compatibility with the different scale of the circuits 410, 430 according to various embodiments of the present invention.

It should be noted that the embodiments illustrated herein are exemplary of a tapered interconnect wherein the cross-section of the interconnect decreases along the axial length thereof to accommodate the provided 210 first circuit layer that is a micro-scale circuit at a first end and accommodate the provided 230 second circuit layer that is a nano-scale circuit at the second end. In the alternative embodiment mentioned above (not illustrated) for the method 200 of electrically interconnecting, wherein the provided 210 first circuit layer is the nano-scale circuit and the provided 230 second circuit layer is the micro-scale circuit, it is within the scope of the present invention to provide 220 an interconnect with a taper angle that is the reverse of the taper angle in the embodiments illustrated herein (i.e., a 'reverse taper').

Thus, there have been described various embodiments of a hybrid-scale electronic circuit, a method of electrically interconnecting different circuits and an internal electrical connection for a hybrid-scale electronic circuit. It should be understood that the above-described embodiments are merely illustrative of some of the many specific embodiments that represent the principles of the present invention. Clearly, those skilled in the art can readily devise numerous other arrangements without departing from the scope of the present invention as defined by the following claims.

What is claimed is:

1. A hybrid-scale electronic circuit comprising:
   a nanoelectronic circuit having a nano-scale electrical contact;
   a microelectronic circuit having a micro-scale electrical contact; and
   an interconnect extending through an insulator layer that separates the nanoelectronic circuit and the microelectronic circuit, the interconnect having a tapered shape, such that a first end of the interconnect has an end dimension that is at least five times larger than an end dimension of a second end of the interconnect, the first end connecting to the micro-scale electrical contact and the second end connecting to the nano-scale electrical contact.

2. The hybrid-scale electronic circuit of claim 1, wherein the end dimension of the first end of the interconnect is five times to one hundred times larger than the end dimension of the second end of the interconnect, the end dimension of the first end approximating a micro-scale dimension, the end dimension of the second end approximating a nano-scale dimension, such that the interconnect is compatible with both the microelectronic circuit and the nanoelectronic circuit.

3. The hybrid-scale electronic circuit of claim 1, wherein the interconnect is a nanowire having an axial length and being tapered along the axial length, the nanowire being electrically conductive.

4. The hybrid-scale electronic circuit of claim 1, wherein the interconnect is a tapered via through the insulator layer, the via comprising a filler material that is electrically conductive.

5. The hybrid-scale electronic circuit of claim 1, wherein the microelectronic circuit is a substrate that supports the insulator layer and the nanoelectronic circuit, wherein the larger end dimension of the first end of the interconnect is a micro-scale dimension comparable to the micro-scale electrical contact on the substrate, the end dimension of the second end of the interconnect being a nano-scale dimension comparable to the nano-scale electrical contact, such that the interconnect has a reduced series resistance between different-scale circuits relative to a conventional columnar interconnect.

6. An internal electrical connection for a hybrid-scale electronic circuit comprising:
   an interconnect having an axial length and a tapered shaped along the axial length, a first end of the interconnect having an end dimension that is at least five times larger than an end dimension of a second end of the interconnect, wherein the end dimension of the first end approximates a micro-scale dimension, the end dimension of the second end approximating a nano-scale dimension, such that the interconnect provides a reduced series resistance connection between different-scale circuits of the hybrid-scale electronic circuit relative to a conventional columnar interconnect.

7. The internal electrical connection of claim 6, wherein the interconnect comprises an insulator that surrounds the axial length of the interconnect, the insulator separating the different-scale circuits.

8. The internal electrical connection of claim 6, wherein the interconnect is a tapered nanowire embedded in an insulator layer that separates the different-scale circuits, the tapered nanowire being electrically conductive.

9. The internal electrical connection of claim 6, wherein the interconnect is a tapered via embedded in an insulator layer that separates the different-scale circuits, the tapered via comprising a filler material that is electrically conductive.

10. A method of electrically interconnecting different-scale circuit layers of a hybrid-scale electronic circuit, the method comprising:
providing a first circuit layer having an electrical contact;
providing an interconnect on the first circuit layer; and
providing a second circuit layer having an electrical contact, one of the first circuit layer and the second circuit layer being a micro-scale circuit with a micro-scale electrical contact and another thereof being a nano-scale circuit with a nano-scale electrical contact,
wherein the interconnect electrically connects between the first circuit layer and the second circuit layer at the respective electrical contacts, the interconnect having an axial length and a tapered shape along the axial length, such that one end of the interconnect has an end dimension that is at least five times larger than an opposite end of the interconnect, the end of the interconnect having the larger end dimension interfacing to the micro-scale electrical contact and the opposite end interfacing to the nano-scale electrical contact.

11. The method of electrically interconnecting circuits of claim 10, wherein the first circuit layer is the micro-scale circuit and the second circuit layer is the nano-scale circuit, and providing an interconnect comprises embedding the interconnect in an insulator layer formed on the micro-scale circuit, such that the micro-scale electrical contact of the micro-scale circuit connects to the larger end dimension of the one end of the interconnect,
and wherein providing the second circuit layer comprises providing the nano-scale circuit on the insulator layer, such that the nano-scale electrical contact of the nano-scale circuit connects to the opposite end of the interconnect.

12. The method of electrically interconnecting of claim 10, wherein providing an interconnect comprises:
growing a nanowire having an angle of taper from a location on the electrical contact of the first circuit layer, such that a first end of the nanowire is connected to the electrical contact on the first circuit layer;
depositing an insulator layer on the first circuit layer to cover the nanowire; and
planarizing the insulator layer to expose an end surface of a second end of the nanowire, wherein the second circuit layer is provided on the insulator layer, such that the electrical contact of the second circuit layer connects to the exposed end surface of the second end of the nanowire.

13. The method of electrically interconnecting of claim 12, wherein growing a nanowire comprises:
using a combination of catalyzed growth and uncatalyzed growth of the nanowire, such that the angle of taper is controlled, the angle of taper being defined by different end dimensions of the first end and the second end of the nanowire and the axial length of the nanowire.

14. The method of electrically interconnecting of claim 12, wherein growing a nanowire comprises using a constant ratio of an uncatalyzed deposition rate of a nanowire material to a catalyzed growth rate of the growing nanowire to achieve the angle of taper of the nanowire.

15. The method of interconnecting circuits of claim 12, wherein growing a nanowire comprises growing a tapered silicon nanowire using a titanium silicide nanoparticle catalyst and a gas mixture comprising 15 standard cubic centimeters per minute (sccm) silane gas, 3 standard liters per minute (slm) hydrogen gas and 15 sccm hydrogen chloride gas at a total pressure of 10 torr in a chemical vapor deposition reaction chamber at a constant temperature of one of 640 degrees centigrade (0° C.), 680° C. and 720° C., such that the first end approximates a micro-scale dimension of the first circuit layer and the second end approximates a nano-scale dimension of the second circuit layer.

16. The method of electrically interconnecting of claim 10, wherein providing an interconnect comprises:
depositing an insulator layer on the first circuit layer;
forming a tapered via through the insulator layer to expose the electrical contact on the first circuit layer, a taper angle of the via being defined by different end dimensions of the via and the axial length of the via; and
filling the tapered via with a filler material, such that the filler material contacts the electrical contact on the first circuit layer at a first end of the tapered via, wherein the second circuit layer is provided on the insulator layer, such that the electrical contact of the second circuit contacts the filler material at a second end of the tapered via.

17. The method of electrically interconnecting of claim 16, wherein filling the tapered via comprises selectively depositing the filler material through the second end of the tapered via onto a surface of the exposed electrical contact at the first end, such that the deposited filler material accumulates until the filler material reaches the second end of the tapered via.

18. The method of electrically interconnecting of claim 17, wherein selectively depositing deposits the filler material on the surface of the exposed electrical contact and on already deposited filler material in the via in preference to depositing on an internal sidewall of the tapered via.

19. The method of electrically interconnecting of claim 16, wherein forming a tapered via comprises:
providing a patterned mask on the insulator layer that defines an opening above the electrical contact on the first circuit layer; and
directionally etching the insulator layer at an angle through the mask opening until the electrical contact on the first circuit layer is exposed, the directional etching providing a taper angle to the via.

20. The method of interconnecting circuits of claim 16, wherein the first circuit layer is the micro-scale circuit, the first end of the tapered via having an end dimension that is comparable to the micro-scale electrical contact, the second circuit layer is the nano-scale circuit, the second end of the tapered via having an end dimension that is comparable to the nano-scale electrical contact.

* * * * *